United States Patent

Chamberlain

[15] 3,686,575

[45] Aug. 22, 1972

[54] VHF-UHF VARACTOR TUNER CONTROL CIRCUIT

[72] Inventor: Richard Travers Chamberlain, Arlington Heights, Ill.

[73] Assignee: Admiral Corporation, Chicago, Ill.

[22] Filed: Feb. 26, 1970

[21] Appl. No.: 14,514

[52] U.S. Cl. ....................325/459, 325/461, 334/15, 338/198

[51] Int. Cl. ..............................................H04b 1/06

[58] Field of Search....338/68, 92, 95, 196, 295, 185, 338/190, 191; 325/459, 464, 461; 334/11, 14, 15

[56] References Cited

UNITED STATES PATENTS

| | | | |
|---|---|---|---|
| 2,544,339 | 3/1951 | Mason | 338/95 |
| 1,391,522 | 9/1921 | Amberton | 338/198 X |
| 3,354,397 | 11/1967 | Wittig | 325/459 |

*Primary Examiner*—Benedict V. Safourek
*Attorney*—Hill, Sherman, Meroni, Gross and Simpson

[57] ABSTRACT

A television tuner control circuit which provides equal presentation of all channels on the VHF and UHF bands is disclosed. The tuner used in combination with the circuit of this invention is capable of receiving both VHF and UHF channels, and includes a plurality of tuned resonant circuits including voltage controlled impedance and switching elements. The control circuit includes a sequential switch for selecting between VHF and UHF bands of broadcast channels and a variable voltage supply device for controlling the impedance and switching elements and thus selecting the channel of interest within the chosen band of frequencies. Utilizing the control circuit of this invention, a single control on the television receiver's control panel may be used to select any station on the VHF and UHF bands.

4 Claims, 2 Drawing Figures

Patented Aug. 22, 1972 3,686,575

INVENTOR
Richard T. Chamberlain
by Pendleton, Neuman, Seibold and Williams
Att'ys

VHF-UHF VARACTOR TUNER CONTROL CIRCUIT

FIELD OF THE INVENTION

This invention is directed to a television tuner and more particularly to a channel selection control circuit providing equal presentation of all stations broadcasting in the VHF and UHF bands.

BACKGROUND OF THE INVENTION

Television tuners as they are now designed require separate controls for tuning in the VHF and UHF television broadcast bands. In one arrangement known to the prior art, a rotary detenting mechanism including 13 distinct switch positions is provided on a television receiver's control panel for tuning the band containing the VHF stations. The VHF band of twelve stations or channels requires twelve detent positions. Power supply voltage is applied to the VHF RF amplifier, oscillator and mixer when the switching mechanism is in any of these twelve positions. The thirteenth detent position is reserved for selecting the UHF band; when the switch is in this position voltage is supplied to the active stages of the UHF tuner. The UHF supply voltage switching function is accomplished by turning the switch mechanism to this position; selection of a station in the UHF band requires the use of a separate UHF channel selector, which is usually a continuous tuning device provided with two cam and gear arrangements for first rough and then fine tuning of the selected station. Thus tuning a UHF station requires three separate tuning operations as compared to the single operation required to tune in a VHF station. Further, since the VHF channel selector is provided with detenting means, it is both quicker and more accurate than the tuning means provided by a UHF channel selector.

It is accordingly a principal object of the present invention to provide a single control which is capable of tuning in all channels on both the VHF and UHF bands.

SUMMARY OF THE INVENTION

A control unit constructed according to the present invention provides equal presentation of all very high frequency (VHF) and ultra high frequency (UHF) channels with a television tuner capable of receiving both VHF and UHF stations. An antenna system associated with the tuner receives all VHF and UHF signals which have sufficient strength to induce a voltage in the antenna. The function of the tuner is to select a particular station's signal from the signals induced in the antenna at a given time. The tuner typically includes a received frequency (RF) amplifier stage for amplifying the selected station's signal, an oscillator generating a reference frequency signal which is a fixed difference from the frequency of the selected station's signal, and a mixer stage for separating an information signal from the received signal by combining the oscillator output signal with the selected station's signal. The mixer output is an intermediate frequency (IF) signal which is coupled to the television receiver. In some cases an intermediate frequency (IF) amplifier stage, which amplifies the IF signal, is connected between the mixer output and the television receiver input.

The tuner disclosed herein includes separate units for selecting the VHF and UHF stations. An antenna input circuit associated with each unit supplies all station signals which have sufficient strength to induce a voltage in the antenna. Each unit includes RF amplifier, oscillator and mixer stages, and the UHF tuner unit includes an IF amplifier stage. One feature of the control circuit of this invention is that the power supply to the active elements (i.e., transistors or the like) of each of the above stages is controlled by the control circuit of this invention. Thus when the VHF tuner unit is operative, no power is supplied to the stages of the UHF tuner unit. When the UHF unit is operative the control circuit disables the active elements only of the VHF RF amplifier and oscillator; the mixer receives power and is used as an IF amplifier for the UHF tuner.

The tuner also includes a number of tuned resonant circuits, one or more tuned circuits being associated with each stage of the tuner. The tuned circuits associated with the amplifiers and mixer are tuned to resonate at the frequency of a selected station, producing a large signal at the selected station frequency and minimum signals at other frequencies. The oscillator's tuned circuit is tuned so that the generated reference signal is always a fixed difference from the selected station.

In order to carry out this tuning process, each tuned circuit includes a variable impedance element. In the preferred embodiment of this invention, each tuned circuit includes a voltage controlled capacitance diode, or varactor diode as the variable impedance element. The control circuit disclosed herein supplies an accurately regulated control voltage to each varactor diode, fixing the impedance of the diode and thus the resonant frequency of the tuned circuit, thereby controlling the selection of a station signal frequency to be applied to the receiver.

Each tuned circuit of the VHF tuner of the preferred embodiment also includes a switching diode which divides the impedance of the tuned circuit into two sections, and thus divides the VHF band selection mechanism into two separate tuning ranges, the first including channels 2—6, the second including channels 7—13. The diodes are switched on and off by a control voltage supplied by the circuit disclosed herein. When the diode is switched off a first range of impedance values is available in each tuned circuit, and one of the channels within the first range may be tuned; when the diode is switched on a second series of impedance values is available and a channel in the second range may be tuned.

The control circuit of this invention provides equal presentation of all channels on the VHF and UHF bands. The control circuit uses parts having non-critical electrical parameters, thus providing an all channel tuner control circuit at a cost comparable to present state of the art tuner control systems.

BRIEF DESCRIPTION OF THE DRAWINGS

For a more complete understanding of the subject invention, reference will now be made to the drawings wherein.

DESCRIPTION OF A PREFERRED EMBODIMENT

Figure 1:
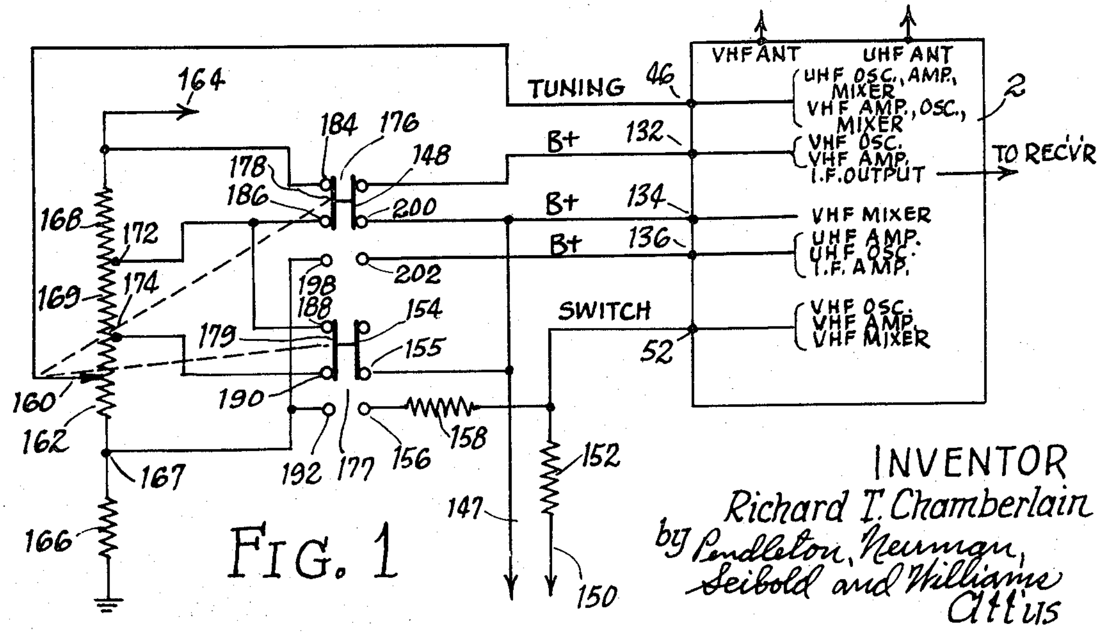
FIG. 1 is a circuit diagram of a control circuit constructed in accordance with the present invention illustrating the general manner in which active sections of a television tuner may be controlled by an application of a voltage of a controlled magnitude and polarity.

Referring now to the drawings and more particularly to FIG. 1, a schematic diagram of a preferred embodiment of a voltage control circuit 1 constructed in accordance with this invention is shown in conjunction with an all-channel television tuner 2. The tuner 2 is capable of tuning in all of the channels in both the VHF and UHF bands.

Figure 2:
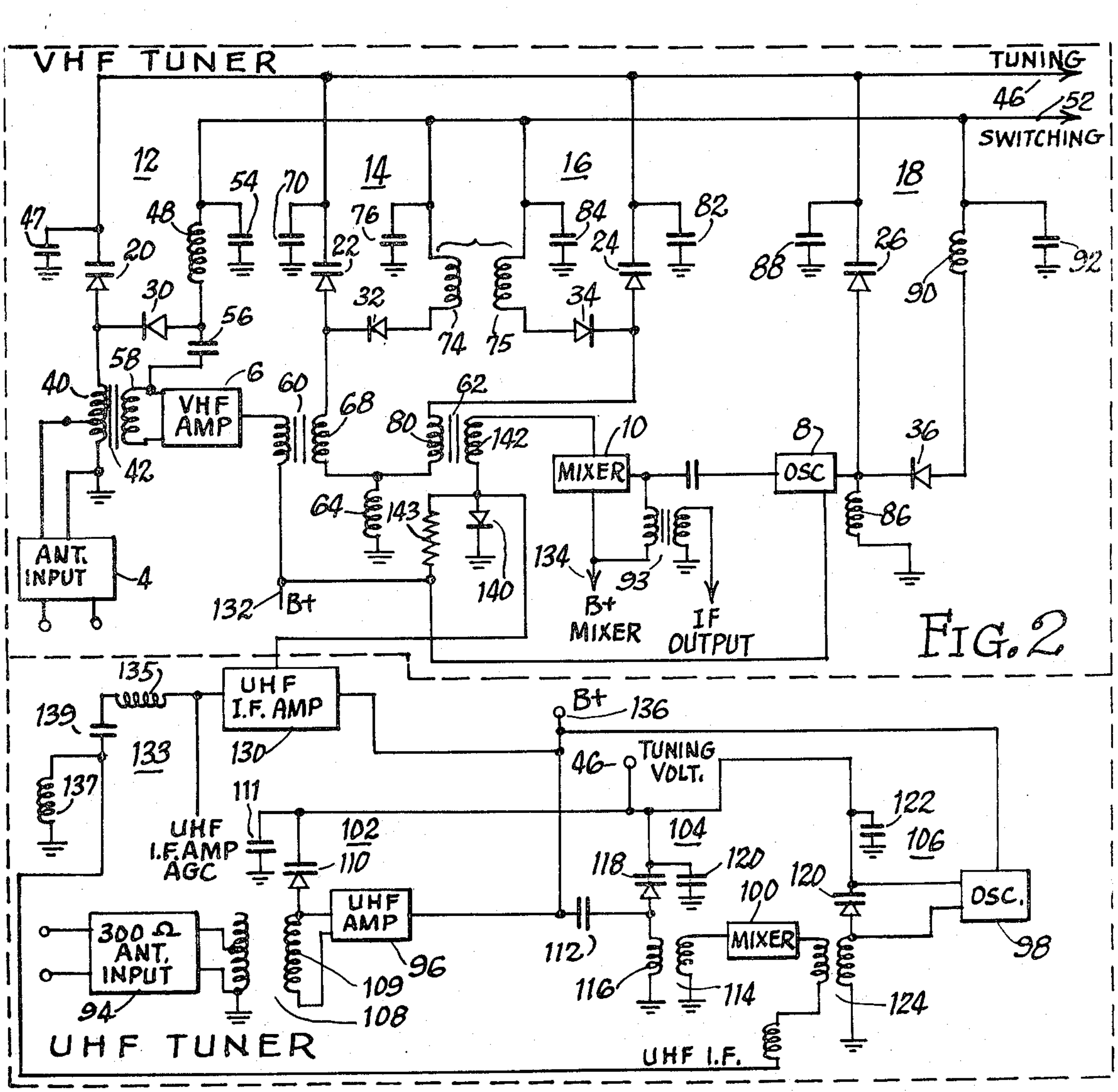
FIG. 2 is a schematic diagram of a tuner which may be used with the control circuit of the present invention.

The VHF tuner unit which is shown in detail in FIG. 2, includes a VHF antenna coupling circuit 4, RF amplifier 6, oscillator 8 and mixer 10. The antenna circuit 4 receives input signals in a band of 12 broadcast frequencies. For ease in station selection, the tuner of this preferred embodiment divides the VHF band into two ranges, the first including stations or channels 2—6, the second including channels 7—13. A desired VHF station's signal is selected by tuning the interstage coupling circuit 12 located between the VHF antenna input 4 and the RF amplifier 6, and interstage coupling circuits 14 and 16 located between the amplifier 6 and mixer 10, to resonate at the frequency of the selected channel. Tuning each of interstage coupling circuits 12, 14 and 16 is accomplished by adjusting the amounts of impedance included in the circuit. These resonant circuits present a low impedance only to signals at or near the resonant frequency, and a high impedance to all other signals.

The impedances of coupling circuits 12, 14 and 16 and the oscillator input impedance 18 which controls the oscillator's output frequency each include a simple parallel tuned resonant circuit.

Each resonant circuit includes the parallel combination of a voltage variable capacitance diode and an inductor or coil. Each tuned circuit also includes a switching diode and an inductor in parallel with the coil. The switching diode divides the inductance of the tuned circuit into two sections corresponding to the two ranges of received signal frequencies and is switched on and off by the voltage control circuit disclosed herein. The switching diodes 30, 32, 34 and 36 are all poled to conduct in the same direction and are controlled by the control circuit of this invention. When the switching diodes are biased off by the control circuit, their associated inductors are removed from the tuned circuit. When the diodes are biased on, the inductor in series with each diode is parallel with the coil of the basic inductor-varactor circuit. The voltage variable capacitance diode, or varactor diode, is a continuously variable tuning element also controlled by the voltage control circuit. The capacitive impedance of varactor diodes 20, 22, 24 and 26 is a function of the magnitude of the bias voltage applied by the control circuit. The impedance is varied to change the circuit's resonant frequency. Thus by means of switching diodes 30 through 36 the VHF band is divided into two ranges of channels, and varactor diodes 20 through 26 control the selection of a specific channel within either range.

Tuned circuit 12 includes the primary 40 of transformer 42 which couples the received carrier signals from antenna input circuit 4 to RF amplifier 6. The cathode of varactor 20 is coupled to voltage control input 46, and a capacitor 47 is connected from the cathode of varactor diode 20 to ground. The voltage applied to input 46 controls the capacitance of varactor 20 and thereby the resonant frequency of tuned circuit 12. Only those signals received by antenna input circuit 4 having a frequency near the resonant frequency of tuned circuit 12 are coupled to the input of amplifier 6.

The switched inductance used to shift ranges of tuned channels is provided by series combination of switching diode 30 and inductor 48 coupled between the anode of diode 20 and voltage control terminal input 52. An RF bypass capacitor 54 is coupled from coil 48 to ground and DC isolation is provided by capacitor 56 between the anode of diode 30 and the secondary 58 of transformer 42.

Channels 2—6 of the VHF band are tuned while a negative bias voltage is applied to diode 30 via input terminal 52. The diode exhibits a high resistance, isolating inductor 48 from affecting tuned circuit 12. A variable positive bias voltage applied to terminal 46 determines the capacitance of varactor diode 20 and thereby by the resonant frequency of the circuit. To tune the upper range of the VHF band, channels 7—13, a positive forward bias is applied to diode 30 connecting inductor 48 in parallel with primary 40 and reducing the impedance of tuned circuit 12. The upper half of the VHF band is now tuned by varying the tuning voltage applied to diode 20. Because the inductance of tuned circuit 12 is sharply reduced by switching on diode 30, the bias voltage applied by tuning input terminal 46 to varactor 20 is varied between the same limits to tune channels 7—13 as it is in tuning channels 2—6.

Tuned circuits 14, 16 and 18 operate in a similar fashion. In each circuit channels 2—6 are tuned utilizing a parallel resonant circuit, the variable impedance being supplied by a varactor diode under control of a bias voltage which varies between established limits. To tune channels 7—13, a switching diode places an added inductor in parallel with the resonant circuit, reducing the total circuit impedance and the circuit is retuned by varying the control voltage between the same limits.

In the circuit of FIG. 2 the output of RF amplifier 6 is coupled to the input of mixer 10 by a complex double tuned circuit including transformers 60 and 62 and grounded coil 64. The parallel resonant output circuit 14 includes secondary 68 of transformer 60, varactor 22 and grounded capacitor 70. The cathode of varactor 22 is coupled to control input 46 for tuning the circuit to pass the frequencies of the lower range of channels; switching diode 32 inserts winding 74 (whose inductance includes some mutual inductance with coil 75) and capacitor 76 in parallel with winding 68, so that the circuit may be tuned to pass the station frequencies in the upper range.

The tuned input circuit to mixer 10 includes primary 80 of transformer 62, varactor 24 and grounded capacitor 82. The impedance to be switched into the resonant circuit by switching diode 34 includes coil 75 (which has mutual inductance with coil 74) and grounded capacitor 84.

The tuned circuit 18 associated with oscillator 8 includes coil 86, varactor diode 26 and grounded capacitor 88. Changing the oscillator frequency to tune in the upper range of channels in the VHF band requires biasing diode 36 on, adding coil 90 and capacitor 92 in parallel with coil 86, reducing the input impedance and generating a higher oscillator frequency. The output of oscillator 8 is capacitively coupled to mixer 10.

The intermediate frequency output of mixer 10 is coupled to the input of the receiver (not shown) via transformer 93.

The UHF tuner also shown in FIG. 2 operates in a manner similar to the VHF tuner having an antenna input coupling circuit 94, RF amplifier 96, oscillator 98 and mixer 100. The parallel resonant circuits included in coupling circuits 102 and 104 and oscillator input impedance 106 each include a varactor diode controlled by the voltage control circuit of this invention. The entire UHF television band is included in a single range of tuned frequencies, obviating the use of switching diodes to change the resonant frequency of the tuned circuits. The UHF tuner includes a transformer 108 for coupling the signals received by antenna input circuit 94 to RF amplifier 96. A resonant circuit which may be tuned to pass frequencies at or near the frequency of a selected UHF channel includes the secondary 109 of transformer 108 and varactor diode 110 whose cathode is coupled to voltage control input 46. Capacitor 111 is connected from the diode's cathode to ground.

The output of amplifier 96 is coupled to the input of mixer 100 via coupling capacitor 112 and transformer 114. A resonant circuit 104 which limits the band of frequencies passed to mixer 98 includes primary winding 116, varactor 118 and grounded capacitor 120.

The frequency of the output signal of oscillator 98 is controlled by varactor diode 120 whose capacitance, as with all other varactor diodes in this circuit, is controlled by the voltage applied to control input terminal 46. A capacitor 122 is connected from the cathode of diode 120 to ground.

The output of oscillator 98 is coupled to an input of mixer 100 by transformer 124. The difference signal generated by mixer 100 from the mixer input signals from RF amplifier 96 and oscillator 98 is the intermediate frequency signal of the receiver; it is coupled to UHF IF amplifier 130 via a band pass filter 133 tuned to this frequency. This filter includes coils 135 and 137 and capacitor 139.

The output of the IF amplifier 130 is coupled to the IF section of the television receiver via VHF mixer 10. The VHF mixer may be used to amplify the IF output of the UHF tuner because the same intermediate frequency (44 megahertz) is used in both the VHF and UHF tuner sections.

To facilitate the dual usage of the VHF mixer 10, the control circuit of this invention controls the supply of positive voltage or B+ to the transistors of the operative stages of the all channel tuner 2. Thus, when a VHF channel is being tuned, B+ power is supplied to VHF amplifier 6, and oscillator 8 via B+ supply input terminal 132 and to mixer 10 via terminal 134. When a UHF channel is tuned, B+ is decoupled from input 132 to VHF amplifier 6 and oscillator 8; it is coupled instead to supply input terminal 136 and thereby to UHF amplifier 96, oscillator 98 and IF amplifier 130. Supply input terminal 134 continues to supply B+ power to VHF mixer 10 for the reasons explained above.

As a further means for separating the UHF and VHF sections of the tuner 2, a switching diode 140 is coupled between the secondary 142 of transformer 62 and ground. When the VHF tuner section is operating, the positive voltage applied to B+ input 132 is coupled through resistor 143 to anode of diode switch 140, biasing the switch on, thereby grounding the transformer secondary 142 as well as the output of the UHF IF amplifier 130 which is connected thereto, and effectively separating the UHF tuner from the VHF tuner. When the UHF tuner is in use, B+ is removed from input 132 and diode 140 is turned off presenting a high impedance, thus allowing the IF output to pass to mixer 10.

A preferred embodiment of the control circuit of this invention which supplies tuning voltage to the varactor diodes of the VHF and UHF sections of the tuner and switching voltages to the switching diodes of the VHF section as well as directing the supply of B+ power to the active elements of the tuner stages is described with reference to the schematic of FIG. 1.

Tuner 2 has five control input terminals 46, 52, 132, 134 and 136; the magnitude and polarity of the control voltages applied by control device 1 to these inputs uniquely determines a station signal frequency to be selected by the tuner 2 and applied to the television receiver.

A source of positive potential or B+, 147, is coupled via two-position movable switch section 148 to either input terminal 132 or 136. Coupling B+ to input 132 energizes the VHF amplifier 6 and oscillator 8, enabling the selection of a VHF channel. Coupling B+ to input 136 energizes the UHF RF amplifier 96 and oscillator 98 and UHF IF amplifier 130 enabling the selection of a UHF channel. The input 134 to VHF mixer 10 is permanently coupled to B+, as this section also serves as an IF amplifier for the UHF section.

A voltage of a fixed magnitude but of either a positive or negative polarity is applied to input terminal 52. If a channel in the VHF band is to be selected, the polarity of the voltage to be applied to input 52 depends upon whether the selected channel is in a lower range (channels 2—6) or upper range (channels 6—13) of the band. As is disclosed above, the VHF channel band is divided into two ranges by dividing each tuned circuit to the VHF tuner into two sections separated by a switching diode. The state of these diodes is controlled by the polarity of the voltage applied to terminal input 52. A negative potential voltage source 150 is directly connected to input terminal 52 via a high-value resistance 152, biasing the diodes normally off. To apply a positive potential to input terminal 52, turning the diodes on and changing the range of tunable VHF channels, switch section 154 is moved to its alternate position connecting terminals 155 and 156. Positive potential source 147 is thus coupled to input terminal 52 via a low value resistance 158. The negative potential at input 52 is defeated due to the relatively high resistance of 152 versus 158.

An advantage of this novel circuit arrangement is that high value resistance 152 limits current flow when the tuner switching diodes are biased off. When the diodes are biased on, changing the diodes to a very low impedance the necessary low resistance path is supplied by the insertion of low value resistance 158 in the path between positive supply 147 and control input 52.

As is disclosed above, each stage of both the VHF and UHF tuner units includes at least one parallel resonant circuit having a varactor diode as a variable tuning element. The resonant frequency of the circuit is controlled by its included varactor diode whose capacitance is controlled by the voltage applied to tuner input 46 by potentiometer arm 160. Arm 160 picks a positive potential voltage off potentiometer 162 which has a source of positive potential 164 coupled to the end thereof. The other end is connected to ground by a fixed resistor 166. Thus a minimum positive potential is always applied to arm 160. In this specific embodiment power source 164 has a positive 30 volt potential; the minimum voltage drop across resistor 166 as measured at the connection 167 between resistor 166 and potentiometer 162 is 2 volts.

Potentiometer 162 is a linear potentiometer divided into three equal resistance sections 168, 169 and 170 by taps 172 and 174. A mechanical switch of conventional design is incorporated in the control circuit of this invention, employing a mechanical linkage between potentiometer arm 160 and switch pairs 176 and 177. Each switch pair is a two position switch including two switch sections which are ganged together. Switch pair 176 includes sections 148 and 178; pair 177 includes sections 154 and 179. The position of potentiometer arm 160 in relation to potentiometer 162 determines the position and electrical function of switched pairs 176 and 177, as is fully described below.

When arm 160 is traversing one section of potentiometer 162, switch sections 178, 179 place direct shorts across the two remaining potentiometer sections. Thus the full potential difference between power source 164 and connection point 167 is across the potentiometer section being traversed. When arm 160 and switched pairs 176 and 177 are in the positions shown in FIG. 1, the tuner can receive one of channels 2 through 6 in the VHF band. Positive potential source 147, B+, is directly connected to the VHF mixer 10 via control input 134 and is also connected via switch section 148 and control terminal 132 to the VHF oscillator 8 and amplifier 6. Switch section 178 is connecting terminals 184 and 186, and section 179 is connecting terminals 188 and 190, thus coupling positive potential source 164 directly to tap 174. A range of 2—30 volts is now available at arm 160 to be applied to the tuner's varactor diodes via control terminal 46. The tuner's coupling circuit may now be tuned to select one of the lower range channels of the VHF band.

In order to tune the upper range channels (7 through 13) of the VHF band, potentiometer arm 160 is moved to a position between taps 172 and 174. Switch pair 177 is moved by a mechanical linkage so that section 179 couples terminals 190 and 192, and section 154 couples terminals 155 and 156. Switch pair 176 remains in the position shown in FIG. 1 and described above. The VHF amplifier 6, oscillator 8 and mixer 10 remain energized as controlled by switch pair 176. The polarity of the voltage controlled by switch pair 177 and applied to the tuner's switching diodes via control terminal 52 is reversed, changing the impedance range of the tuner's tuned resonant circuits so that the upper frequency range of channels may be received. Switch section 178 couples positive potential source 164 to tap 172 of the potentiometer section 169; tap 174 of section 169 is now coupled to ground via section 179 and resistor 166. Thus the same voltage range used to tune the lower VHF channel range is now used to tune the upper VHF channel range, being coupled to the tuner varactor diodes via arm 160 and terminal 46.

To tune the UHF channel band, arm 160 is moved to a position adjacent potentiometer section 168. A mechanical linkage moves switch pair 176 to a position such that section 178 now connects terminals 186 and 198 and section 148 connects terminals 200 and 202. Switch pair 177 remains in the position described above, connecting terminals 190 and 192 and terminals 155 and 156.

Positive potential source 147, B+, is now removed from the VHF amplifier 6 and oscillator 8. It is coupled via section 148 to control terminal 136, energizing the transistors of the UHF RF amplifier 96, oscillator 100, and IF amplifier 130. Mixer 10 remains energized and provides an additional stage of IF amplification for the UHF tuner output.

One end of potentiometer section 168 is now connected directly to potential source 164; the opposite end, at tap 172, is connected to ground via switch section 178 and resistor 166. The control voltage for the varactor diodes is applied to the diodes of the UHF section via arm 160 and control terminal 46.

Thus the same source of potential used to provide linear tuning of both ranges of the VHF channel band provides linear tuning of the UHF channel band.

A single control knob (not shown) makes the selection of any VHF or UHF channel. Placing arm 160 adjacent potentiometer section 170 leaves the switch pairs in the positions shown and determines that a VHF channel in the lower range (2—6) shall be selected. Placing the arm adjacent section 169 moves pair switch 177 via a mechanical linkage to its alternate position (not shown) as is described above. Pair switch 176 is unmoved. Thus the channel to be selected must now be one from the upper VHF range (7—13) the polarity of the voltage applied to the switching diodes via input terminal 52 being reversed. Placing the arm 160 adjacent section 168 causes mechanically linked pair switch 176 to move to its alternate position (not shown); pair switch 177 remains in its alternate position. As a result B+ is removed from the VHF tuner stages and applied to the UHF tuner stages so that a channel may be selected from the UHF band. A potential difference of 28 volts is applied across each potentiometer section when the arm is adjacent that section. Arm 160 picks off this voltage or any part thereof and applies it to the tuner's varactor diodes to select a desired channel.

The control circuit configuration disclosed provides equal presentation of all television channels on both the VHF and UHF bands, utilizing a single tuning control. No secondary tuning or fine tuning is required. If in certain applications a fine tuning control is desirable, one may be added by placing a variable resistor (not shown) in shunt with potentiometer 162, connected between arm 160 and positive potential source 164. The potentiometer disclosed herein may have either a rotary or linear motion control, with mechanical linkage for channel detenting if desired, without modification of the circuit. The cables and/or leads to the tuner from the control circuit are kept to a minimum and have non-critical electrical parameters.

The control circuitry disclosed herein keeps circuitry cost at a minimum comparable to present state of the art tuner control systems.

While a particular embodiment of this invention is shown above and described, it will be understood, of course, that the invention is not to be limited thereto, since many modifications may be made. It is contemplated, therefore, by the appended claims, to cover any such modifications as fall within the true spirit and scope of this invention.

I claim:

1. The combination of a varactor tuning system having a number of varactors for controlling the frequency of tuning, said varactor tuning system having at least first and second band sections, each of said band sections having switching means associated therewith for initiating operation of said band sections, a potentiometer, said potentiometer having at least one fixed tap defining first and second sections thereby, a movable tap associated with the potentiometer and being continuously movable from said first to said second section, first switch means responsive to the position of the movable tap for causing a voltage to be applied across a predetermined one of said potentiometer sections, means for coupling the movable tap to the varactors, and second switch means for controlability coupling a switching voltage to the band switching of one of the two band sections.

2. The combination as described in claim 1 wherein said varactor tuning system has a VHF band section and a UHF band section and wherein said second switch means controls the coupling of said switching voltage to each of said VHF and UHF band sections.

3. The combination as described in claim 2 wherein said VHF band section has a lower VHF portion and an upper VHF portion and wherein said potentiometer has three sections, one for said lower VHF, one for said upper VHF portion, and one for said UHF section.

4. In a television receiver having a VHF varactor tuner and a UHF varactor tuner, a potentiometer having at least one fixed tap defining a number of sections and having a movable tap arranged to supply an output voltage to respective varactors of each of said tuners, sequence switch means capable of being coupled across each of said sections of the potentiometer for switching a fixed voltage across any one section thereof, said sequence switch means being operated by said movable tap, band switching means for switching operation between said tuners, said sequence switch means also controlling the operation of said band switching means whereby VHF and UHF tuning of the television receiver may be accomplished by continued movement of said movable tap.

* * * * *